United States Patent [19]
Toya et al.

[11] Patent Number: 5,449,545
[45] Date of Patent: Sep. 12, 1995

[54] CERAMIC DEVICE

[75] Inventors: Eiichi Toya; Yukio Itoh, both of Yamagata; Takashi Tanaka, Hadano; Yasumi Sasaki, Nagai, all of Japan

[73] Assignee: Toshiba Ceramics Co., Ltd., Tokyo, Japan

[21] Appl. No.: 6,856

[22] Filed: Jan. 21, 1993

[30] Foreign Application Priority Data

Jan. 22, 1992 [JP] Japan .................. 4-029957
Jan. 20, 1993 [JP] Japan .................. 5-023495

[51] Int. Cl.$^6$ .................................... G03F 9/00
[52] U.S. Cl. .................................... 428/138; 428/137; 428/141; 428/209; 428/336; 428/408; 428/446; 428/698; 428/699
[58] Field of Search ................ 428/446, 699, 336, 408, 428/209, 141, 137, 138, 698

[56] References Cited

U.S. PATENT DOCUMENTS

| | | | |
|---|---|---|---|
| 4,659,606 | 4/1987 | Wada et al. | 428/141 |
| 4,804,600 | 2/1989 | Kato et al. | 430/5 |
| 4,808,463 | 2/1989 | Yoshikatsu et al. | 428/216 |
| 4,941,942 | 7/1990 | Bains et al. | 156/657 |
| 5,178,727 | 1/1993 | Toya et al. | 156/644 |

*Primary Examiner*—A. A. Turner
*Attorney, Agent, or Firm*—Foley & Lardner

[57] ABSTRACT

A ceramic device is disclosed that has a silicon base plate, a first ceramic film formed on a first surface of the silicon base plate, a second ceramic film formed on a second surface of the silicon base plate opposite to the first surface, and an operation opening formed in the silicon base plate between the first and second surfaces. A surface portion of the first ceramic film exposed to the operation opening Is a mirror surface having 0.05 micrometers or less of center line average height Ra. A mirror surface keeping film can be formed between the first surface of the silicon base plate and the first ceramic film for keeping a mirror surface in an etching step to etch the silicon base plate, and the silicon base plate can be reduced partially in the etching step for forming an operation opening thereby exposing a corresponding portion of the mirror surface keeping film to the operation opening.

28 Claims, 4 Drawing Sheets

CERAMIC DEVICE

BACKGROUND OF THE INVENTION

This invention relates to a ceramic device and method for producing the same which is used as photomask when an electric circuit is drawn on a semiconductor wafer.

PRIOR ART

This kind of ceramic device is disclosed in Japanese Patent Laid-open No. 3-179445. The conventional ceramic device, as shown in FIG. 10, is produced in a method which comprises steps of coating a first end face of a silicon base 1 with a ceramic film 2, coating both the other end face and an outer side face with a ceramic film 3 having a central hole, and reducing a portion of the silicon base 1 by etching from the side of the second end face so as to form an operation opening 4. The first and the second ceramic films 2, 3 are made of at least one of silicon carbide and silicon nitride. Silicon carbide ceramic film and silicon nitride ceramic film are produced according to following chemical formulas.

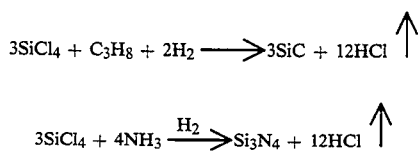

$$3SiCl_4 + C_3H_8 + 2H_2 \longrightarrow 3SiC + 12HCl \uparrow \quad (1)$$

$$3SiCl_4 + 4NH_3 \xrightarrow{H_2} Si_3N_4 + 12HCl \uparrow \quad (2)$$

A surface portion 5 of the ceramic film 2 being exposed to the operation opening 4 is used as ceramic thin film for a photomask.

When the first ceramic film 2 is formed according to formula 1 or 2, HCl is generated. The surface of the silicon base 1 is etched by HCl when the first ceramic film 2 is formed thereon. Accordingly the mirror surface of the silicon base 1 is damaged. Therefore an inside surface 5 of the first ceramic film 1 formed on the damaged surface is uneven and has, for example, 0.1 micron meters–1.0 micron meters of surface roughness.

If such a ceramic device is used as a photomask when drawing a circuit pattern on a semiconductor wafer, no sharp focus is obtained because of the rough inside surface 5 of the first ceramic film 2. Therefore a circuit pattern with high accuracy cannot be drawn on a wafer.

SUMMARY OF THE INVENTION

An object of the invention is to provide a ceramic device having such a ceramic film that can be used as a photomask for drawing a high accuracy pattern, and a method for producing the same.

According to the invention a ceramic device is provided comprising a silicon base plate, a first ceramic film formed on a first surface of the silicon base plate, a second ceramic film formed on a second surface of the silicon base plate opposite to the first surface, and an operation opening formed in the silicon base plate between the first and second surfaces, wherein a surface portion of the first ceramic film exposed to the operation opening is a mirror surface having 0.05 micrometers or less of center line average height Ra.

According to the invention a ceramic device also is provided comprising a silicon base plate, a first ceramic film formed on a first surface of the silicon base plate, and a second ceramic film formed on a second surface of the silicon base plate, wherein a mirror surface keeping film is formed between the first surface of the silicon base plate and the first ceramic film for keeping a mirror surface in an etching step to etch the silicon base plate, and wherein the silicon base plate is reduced partially in the etching step for forming an operation opening thereby exposing a corresponding portion of the mirror surface keeping film to the operation opening.

According to the invention a method also is provided for producing a ceramic device which comprises the steps of forming a mirror surface keeping film on a first surface of a silicon base plate for keeping a mirror surface in an etching step to etch the silicon base plate, forming a first ceramic film on the mirror surface keeping film, forming a second ceramic film on a second surface of the silicon base plate opposite to the first surface, reducing a portion of the silicon base plate by etching from the second surface to form an operation opening thereby exposing a corresponding portion of the mirror surface keeping film to the operation opening. And a portion of the mirror surface keeping film which is exposed to the operation opening can be reduced so as to let a corresponding portion of the first ceramic film be exposed to the operation opening.

PREFERRED EMBODIMENT OF THE INVENTION

Preferred embodiments of the invention will be explained with reference to the drawings.

Figure 1:
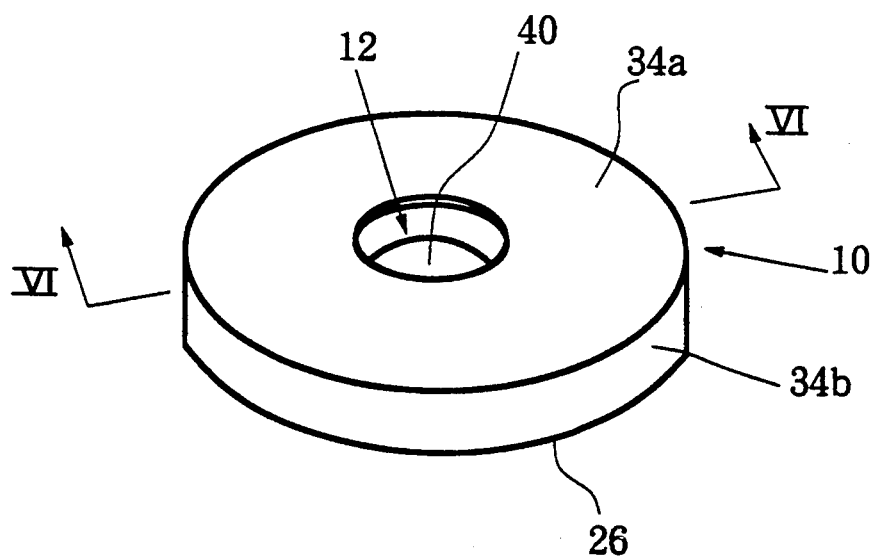
FIG. 1 is a perspective view showing a preferred embodiment of a ceramic device according to the invention.

FIG. 1 is a perspective view showing a first preferred embodiment of the invention.

A ceramic device 10 has a ceramic film to be used as photomask, for example, in the X-ray lithographic art. The ceramic device 10 is generally disk-shaped. A cylindrical operation opening 12 is formed by etching in a center of a silicon base plate 20.

Figure 6:
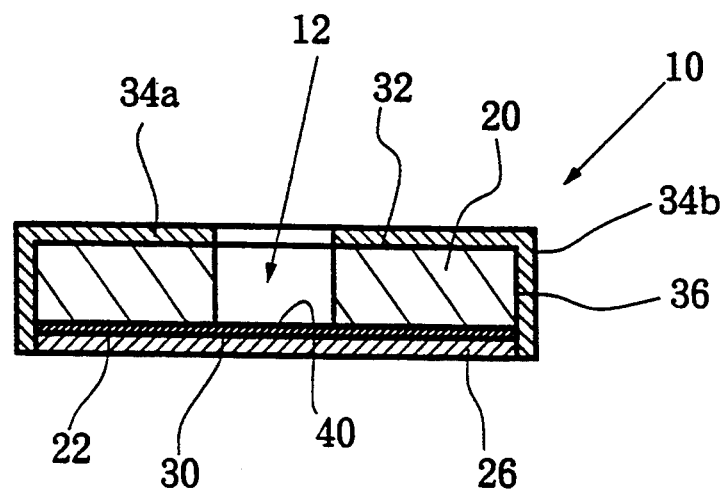
FIG. 6 is a sectional view of the ceramic device taken along lines VI—VI of FIG. 1.

FIG. 6 is a longitudinal sectional view of the ceramic device 10 taken along lines VI—VI in FIG. 1.

In the ceramic device 10, as shown in FIG. 6, a mirror surface keeping film 30 is coated on a first surface 22 of the silicon base plate 20 by, for example, chemical vapor deposition. The silicon base plate 20 has a central operation opening 12 and is ring-shaped. On the mirror surface keeping film 30 a first ceramic film 26 is coated by chemical vapor deposition. The mirror surface keeping film 30 operates for protecting the first ceramic film 26.

A second ceramic film 34a, 34b is formed on a second surface 32 and outer side surface. Namely on the second surface 32 the second ceramic film 34a is coated by chemical vapor deposition and on the outer side surface the second ceramic film 34b is coated similarly.

The operation opening 12 in the center of the silicon base 20 is not rectangular but circular in cross section. This is because cracks will be easily caused by thermal shock at corner portions if the operation opening 12 is rectangular in cross section. The cross sectional shape of the operation opening 12 may be not only a circle but also some other rounded shape such as an ellipse.

The silicon base plate 20 is preferably 100–1000 micrometers in thickness. If the thickness is less than 100 micrometers the first and second ceramic films 26, 34a will be easily curved in a cooling step after their formation by chemical vapor deposition. The curvature results from the difference of thermal expansion coefficients between the silicon base plate 20 and the first and second ceramic films 26, 34a. On the other hand if the thickness exceeds 1000 micrometers the time required for etching and consequently the production cost will be increased.

The first ceramic film 26 and the second ceramic film 34a, 34b have preferably the same or similar composition in order to minimize the difference in their thermal expansion coefficients. The first ceramic film 26 and the second ceramic film 34a, 34b are made of, for instance, at least one of silicon carbide and silicon nitride.

The first ceramic film 26 has preferably 0.5–20 micrometers of thickness. If the thickness is less than 0.5 micrometers it will be hard to maintain the strength. On the other hand if the thickness exceeds 20 micrometers the first ceramic film 26 will be easily broken away from the silicon base plate 20 because of the difference of thermal expansion coefficients therebetween.

The second ceramic film 34a is preferably 0.5–1.5 times of the first ceramic film 26 in thickness for controlling the difference between their thermal expansions in allowable range. If it is less than 0.5 times, in cooling step the thermal stress of the second ceramic film 34a will be too small in comparison with that of the first ceramic film 26. If it exceeds 1.5 times, the thermal stress of the second ceramic film 34a will be too large in comparison with that of the first ceramic film 26.

The mirror surface keeping film 30 is preferably 0.05 micrometers–2.0 micrometers in thickness. If it is less than 0.05 micrometers the flatness of the first ceramic film 40 will deteriorate because of a little permeation of etching liquid or gas. If it exceeds 2.0 micrometers crack will be caused by the thermal expansion difference between the mirror surface keeping film 30 and the first ceramic film 26.

The mirror surface keeping film 30 is made of a material that will not be damaged but can maintain the mirror finished surface even if exposed to etching medium, for example, a HCl gas. Such a mirror surface keeping film 30 is preferably formed by a coating film of thermally decomposed carbon. Thermally decomposed carbon is produced by reacting organic substances as carbon source gas. A $SiO_2$ film can be also used as the mirror surface keeping film 30. A $SiO_2$ film is formed by reacting $H_2O$ with Si of the silicon base plate 20. A $SiO_2$ film is also formed by reacting a rich gas containing both Si and C with a rich gas containing $O_2$.

At least an inner surface portion 40 of the mirror surface keeping film 30 that is exposed to the operation opening 20 is to be a mirror surface (mirror finished surface).

It is preferable that an outer surface of the first ceramic film 26 is also a mirror surface (mirror finished surface) similar to the inner surface portion 40 of the mirror surface keeping film 30.

In the ceramic device 10 shown in FIG. 1 and 6, the inner surface portion 40 of the mirror surface keeping film 30 that is exposed to the operation opening 12, which is formed by etching, is not damaged by the etching step but keeps a mirror surface. This inner surface is to be a mirror surface having 0.05 micrometers or less of center line average height Ra (JIS B 0601).

A method for producing a ceramic device according to this invention will be explained with reference to FIGS. 2–6.

Figure 2:
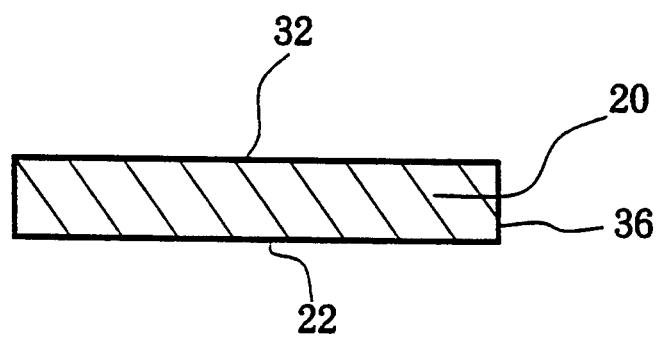
FIG. 2 is a sectional view showing a silicon base plate of the ceramic device according to the invention.

FIG. 2 shows a disk-like silicon base plate 20 as a starting member. The silicon base plate 20 has preferably 50–260 mm of outer diameter and 100–1000 micrometers of thickness. A first surface 22 of the silicon base plate 20 is polished by mirror grinding (polishing).

Figure 3:
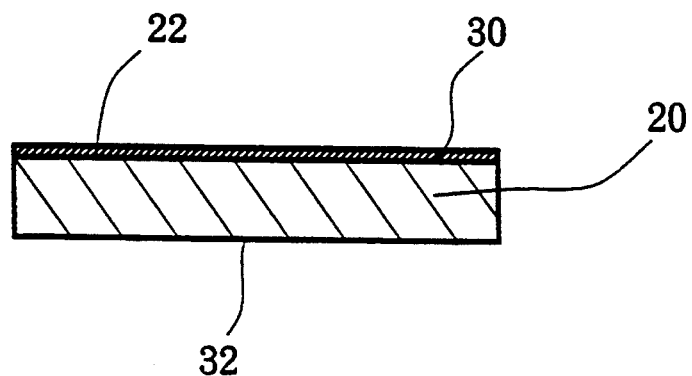
FIG. 3 is a sectional view showing a stage in which a second ceramic film has been formed on a second surface of the silicon base of the ceramic device according to the invention.
Figure 4:
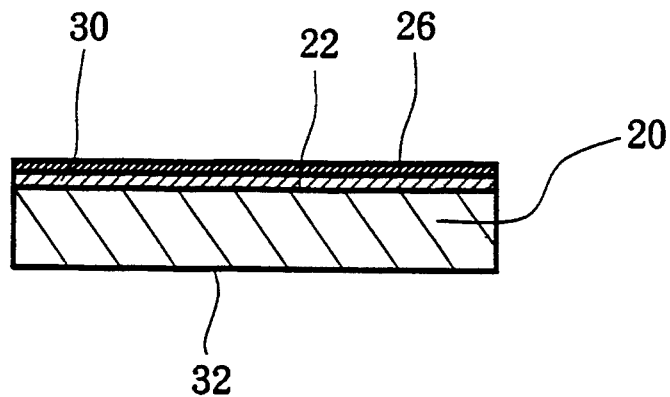
FIG. 4 is a sectional view showing a stage in which a film has been formed on a first surface of the silicon base plate of the ceramic device according to this invention.

As shown in FIG. 3, the silicon base plate 20 is set in a heat treating furnace with the first surface 22 facing upward. Then the first surface 22 is coated with a mirror surface keeping film 30. Namely the coating film of thermally decomposed carbon is formed on the first surface. A $SiO_2$ film can be formed by reacting $H_2O$ with Si of the silicon base plate. A $SiO_2$ film can be also formed by reacting a rich gas containing both Si and C with a rich gas containing $O_2$.

Then the silicon base plate 20 is set in a heat treating furnace. The underside of the silicon base 20 is supported and the mirror surface keeping film 30 faces upward. In the similar manner as described with respect to FIG. 3, a $H_2$ gas as carrier gas, a $SiCl_4$ gas as silicon source gas and a $C_3H_8$ gas as carbon source gas are mixed in a predetermined ratio and supplied in the furnace at a total flow rate of 15 l/min. for ten minutes. By this chemical vapor deposition, a first ceramic film 26 is coated on the mirror surface keeping film 30. The first ceramic film 26 is made of silicon carbide and has 10 micrometers of thickness.

Thereafter the silicon base plate 20 is taken out of the furnace.

Then the silicon base plate 20 is turned upside down. A disk 46 having 30–240 mm diameter is put on the center of the second surface 32 of the silicon base 20, the second surface 32 facing upward. The disk 46 is made of $SiO_2$.

Then the silicon base plate 20 with the disk 46 carried thereon is set in a heat treating furnace (not shown). And a second surface 32 of the silicon base plate 20 is coated by said reaction according to the formula 1.

For example, after mirror grinding the first surface 22 of the silicon base plate 20 having 450 micrometers of thickness and 100 mm of diameter, the silicon base plate 20 is set in a heat treating furnace in such a manner that it is supported on a support member (not shown) by the underside. The silicon base plate 20 carries the disk 46 thereon which has 80 mm of diameter and 5 mm of thickness. And the surface temperature of the silicon base plate 20 is maintained at 1200 20 C.

Figure 5:
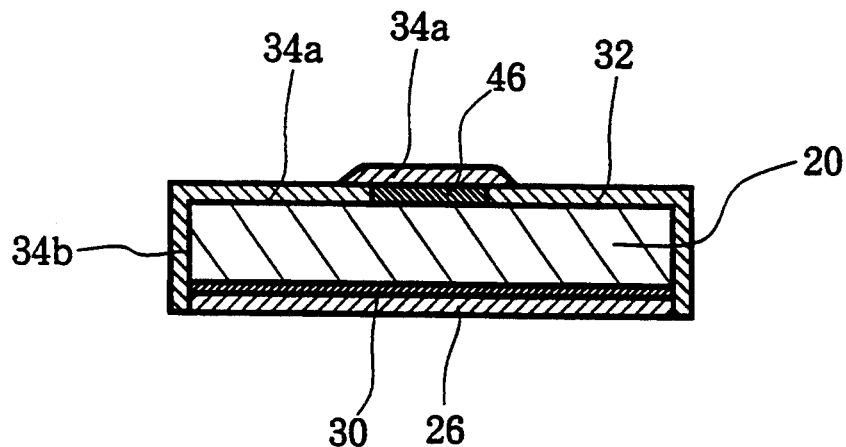
FIG. 5 is a sectional view showing a stage in which a first ceramic film has been formed on a mirror surface keeping film on the silicon base plate of the ceramic device according to this invention.

A $H_2$ gas as carrier gas, a $SiCl_4$ gas as silicon source gas and a $C_3H_8$ gas as carbon source gas are supplied in the heat treating furnace at a total flow rate of 15 1/min. for ten minutes. By this chemical vapor deposition silicon carbide film 34a, 34b having a thickness of 10 micrometers are coated on the second surface 32 and outer side surface 36 of the silicon base plate 20, as shown in FIG. 5. Thereafter the silicon base plate 20 is taken out of the furnace.

Then the disk 46 is removed, as shown in FIG. 6, so that at a center of the second ceramic film 34a a hole of 80 mm diameter is formed.

Next the silicon base plate 20 is treated in the following manner to be in a stage as shown in FIG. 6. The silicon base 20 is set in a heat treating furnace with its first ceramic film 26 facing downward while its second ceramic film 34a faces upward. Then gas phase etching is performed on it by a high density HCl gas at a high temperature for a predetermined time being strictly controlled. The etching temperature is preferably, for instance, 1100° C. By this etching treatment an operation opening 12 is formed in a center of the silicon base plate 20. An inner surface portion 40 of the mirror surface keeping surface 30 is exposed to the operation opening at its bottom. The inner surface portion 40 is not damaged by HCl gas in etching but keeps its mirror surface.

Figure 9:
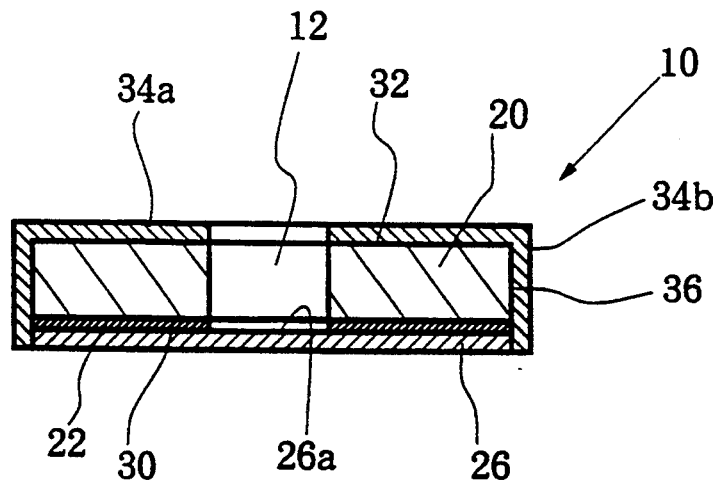
FIG. 9 is a sectional view showing a further embodiment of a ceramic device according to the invention.
Figure 10:
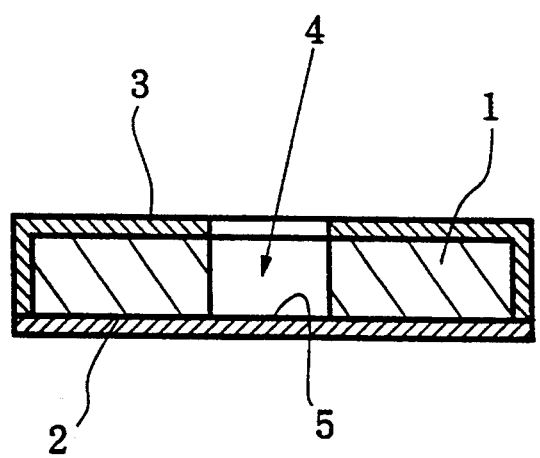
FIG. 10 is a longitudinal sectional view showing a ceramic device of prior art.

FIG. 9 shows a second embodiment according to the invention.

A ceramic device of the second embodiment is produced from the ceramic device of the first embodiment according to the invention, by reducing a portion of the mirror surface keeping film 30 made of thermally decomposed carbon. An inner surface portion 26a of the first ceramic film 26 exposed to the operation opening 12 is used as a ceramic thin film for a photomask.

The second embodiment will be further explained. As shown in FIG. 9, the second ceramic film 34a, 34b is formed on one end face 32 and the outer side face 36, and the first ceramic film 26 is formed on the other end face 22. These first and second ceramic films 26, 34a, 34b are made of at least one of silicon carbide and silicon nitride. The mirror surface keeping film 30 lies between the first ceramic film 26 and the silicon base plate 20. It is not the mirror surface keeping film 30 but the inner surface portion 26a of the first ceramic film 26 that is exposed to the operation opening 12. The operation opening 12 is formed by reducing partially the silicon base plate 20 in the etching treatment.

The ceramic film of silicon carbide or silicon nitride is respectively formed according to following formulas similar to the first embodiment.

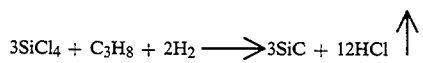
(1)

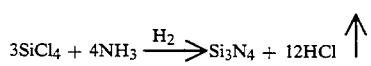
(2)

The portion of the mirror surface keeping film 30 of thermally decomposed carbon is reduced by, for example, the following oxidation treatment. The ceramic device 10 of the first embodiment is heated at slow heating rate up to 800° C. and held at this temperature for 30 minutes under an air atmosphere in a heat furnace. Thereafter it is soaked in a hydrofluoric nitric acid (the ratio being, hydrofluoric acid: nitric acid: water=1:1:4) at 30° C. for 5 hours. By said treatments the portion of the mirror surface keeping film 30 is reduced so that a ceramic device of the second embodiment is produced from the first embodiment.

Thus the inner surface portion 26a of the first ceramic film 26 is formed by reducing partially the silicon base plate 20 in the etching treatment and thereafter by reducing the mirror surface keeping film 30 of thermally decomposed carbon in the oxidation treatment. The inner surface portion 26a of the first ceramic film 26 is used as a ceramic thin film for a photomask.

The surface portion 26a of the first ceramic film 26 exposed to the operation opening has a mirror surface which is 0.05 micrometers or less of center line average height defined in JIS B 0601. If the center line average height is more than 0.05 micrometers a circuit pattern cannot be drawn with high accuracy by X-ray on a semiconductor wafer when it is used as photomask. This inaccuracy results from a faded focus. The center line average height is preferably measured by a surface roughness tester which uses a three dimensional laser.

In the first embodiment, if the mirror surface keeping film 30 has such a smooth mirror surface that it cannot be measured by the laser measuring instrument which can measure a center line average height Ra in 0.01 micrometers range, the surface portion 26a of the first ceramic film 26 exposed to the operation opening 12 has the same smooth mirror surface as the mirror surface keeping film 30.

Figure 7:
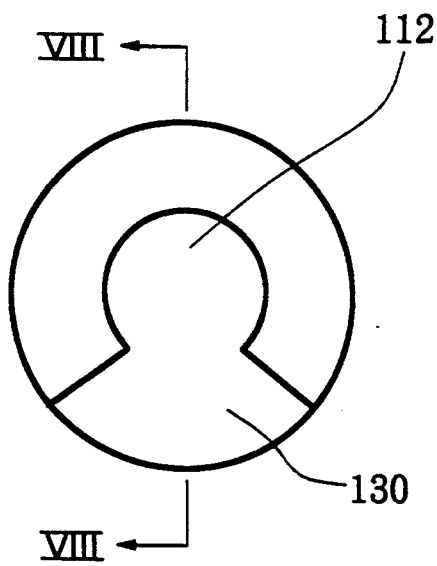
FIG. 7 is a plan view showing another embodiment of a ceramic device according to the invention.
Figure 8:
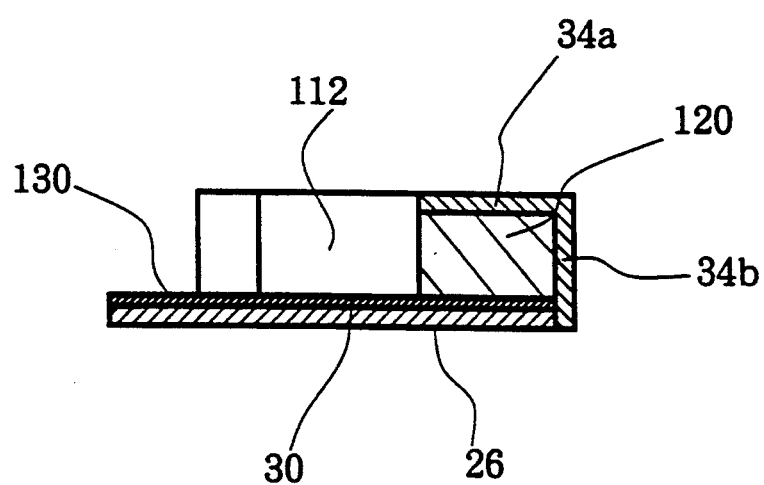
FIG. 8 is a sectional view taken along lines VIII—VIII of FIG. 7.

This invention is not restricted to the first and second embodiments. For instance, a further embodiment shown in FIGS. 7, 8 has a reduced peripheral portion 130 besides a central operation opening 112. The peripheral opening 130 lies over a portion that is less than or equal to ⅔ of the overall circumference, so that a light weight ceramic device can be produced. This embodiment is similar to the first embodiment except for the peripheral opening 130. A ceramic device according to the invention has not only a circular cross section but other shapes such as a rectangular one. In the embodiment of FIGS. 7, 8, an exposed portion of the mirror surface keeping film 30 can be reduced in the same manner as the embodiment shown in FIG. 9.

Advantage of the Invention

When a ceramic device according to the invention is used as photomask, even in a case either a mirror surface keeping film or a ceramic film is exposed to the operation opening, a high accuracy pattern can be drawn on a wafer. It is because that the mirror surface keeping film or the ceramic film has respectively a desired mirror surface so that a good drawing can be performed without faded focus.

We claim:
1. A ceramic device comprising:
   a silicon base plate,
   a first ceramic film formed on a first surface of the silicon base plate,
   a mirror surface keeping film having 0.05 micrometers or less of centerline average height Ra provided between the silicon base plate and the first ceramic film,
   a second ceramic film formed on a second surface of the silicon base plate opposite to the first surface, and an operation opening formed in a central portion of the silicon base plate, said operation opening being through said second ceramic film and through said silicon base plate, thereby leaving said mirror surface keeping film exposed to the operation opening.

2. A ceramic device comprising:
   a silicon base plate,
   a first ceramic film formed on a first surface of the silicon base plate,
   a second ceramic film formed on a second surface of the silicon base plate, and
   a mirror surface keeping film formed between the first surface of the silicon base plate and the first ceramic film, wherein said mirror surface keeping film keeps a mirror surface in an etching step to etch an operation opening in a central portion of the silicon base plate thereby exposing a portion of the mirror surface keeping film corresponding to the operation opening, the mirror surface having 0.05 micrometers or less of centerline average height Ra.

3. A ceramic device according to claim 1, wherein the operation opening has a round shape and said device is ring-shaped.

4. A ceramic device according to claim 2, wherein the operation opening has a round shape and said device is ring-shaped.

5. A ceramic device as claimed in claim 3, additionally comprising a peripheral opening through said second ceramic film and through said silicon base plate and contiguous with the operation opening, such that the silicon base plate has a discontinuous ring shape.

6. A ceramic device as claimed in claim 4, additionally comprising a peripheral opening through said second ceramic film and through said silicon base plate and contiguous with the operation opening, such that the silicon base plate has a discontinuous ring shape.

7. A ceramic device as claimed in claim 1, wherein the silicon base plate has a thickness of 100–1000 microns.

8. A ceramic device as claimed in claim 2, wherein the silicon base plate has a thickness of 100–1000 microns.

9. A ceramic device as claimed in claim 1, wherein the first and second ceramic films have identical or similar compositions.

10. A ceramic device as claimed in claim 2, wherein the first and second ceramic films have identical or similar compositions.

11. A ceramic device as claimed in claim 1, wherein the second ceramic film is 0.5–1.5 times the thickness of the first ceramic film.

12. A ceramic device as claimed in claim 2, wherein the second ceramic film is 0.5–1.5 times the thickness of the first ceramic film.

13. A ceramic device as claimed in claim 1, wherein the mirror surface keeping film is 0.05 to 2.0 microns in thickness.

14. A ceramic device as claimed in claim 2, wherein the mirror surface keeping film has a thickness of 0.05 to 2.0 microns.

15. A ceramic device as claimed in claim 1, wherein the mirror surface keeping film is a film of thermally decomposed carbon.

16. A ceramic device as claimed in claim 2, wherein the mirror surface keeping film is a coating of thermally decomposed carbon.

17. A ceramic device as claimed in claim 1, wherein the mirror surface keeping film is a film of $SiO_2$.

18. A ceramic device as claimed in claim 2, wherein the mirror surface keeping film is a SiO2 film.

19. A ceramic device as claimed in claim 1, wherein an outer surface portion of the first ceramic film that faces away from said silicon base plate constitutes a mirror surface.

20. A ceramic device as claimed in claim 2, wherein an outer surface portion of the first ceramic film that faces away from said silicon base plate constitutes a mirror surface.

21. A ceramic device as claimed in claim 1, additionally comprising a peripheral opening through said second ceramic film and through said silicon base plate and contiguous with the operation opening.

22. A ceramic device as claimed in claim 2, additionally comprising a peripheral opening through said second ceramic film and through said silicon base plate and contiguous with the operation opening.

23. A ceramic device as claimed in claim 2, wherein the etching is performed with HCl gas and the mirror surface keeping film is a material that maintains a mirror surface in HCl gas.

24. A ceramic device comprising:
   a ring-shaped silicon base plate having an operation opening,
   a first ceramic film formed on a first surface of the silicon base plate and over said operation opening,
   a second ceramic film formed on a second surface of the silicon base plate, and
   a mirror surface keeping film formed between the first surface of the silicon base plate and the first ceramic film and between the operation opening and the first ceramic film, whereby a portion of an inner surface of the mirror surface keeping film exposed to the operation opening has a mirror surface having 0.05 micrometers or less of center line average height Ra.

25. A ceramic device comprising:
   a ring-shaped silicon base plate having an operation opening,
   a first ceramic film formed on a first surface of the silicon base plate and over said operation opening,
   a mirror surface keeping film having 0.05 micrometers or less of centerline average height Ra provided between the silicon base plate and the first ceramic film, and
   a second ceramic film formed on a second surface of the silicon base plate, wherein said mirror surface keeping film keeps a mirror surface in an etching step to etch the operation opening whereby the mirror surface keeping film is exposed to the operation opening.

26. A ceramic device comprising:
   a silicon base plate with a thickness of 100–1000 $\mu m$,
   a first ceramic film formed on a first surface of the silicon base plate,
   a mirror surface keeping film having 0.05 micrometers or less of centerline average height Ra provided between the silicon base plate and the first ceramic film,
   a second ceramic film with a thickness 0.5–1.5 times the thickness of the first ceramic film formed on a second surface of the silicon base plate opposite to the first surface, and
   an operation opening formed in a central portion of the silicon base plate, said operation opening being through said second ceramic film and through said silicon base plate, thereby leaving said mirror surface keeping film exposed to the operation opening.

27. A ceramic device according to claim 26, wherein the operation opening is rounded and the first ceramic film has a thickness of 0.5 to 20 μm.

28. A ceramic device as claimed in claim 1, wherein the mirror surface keeping film is formed on the silicon based plate by chemical vapor deposition.

* * * * *